(12) United States Patent
Koyanagi et al.

(10) Patent No.: US 7,303,990 B2
(45) Date of Patent: Dec. 4, 2007

(54) NICKEL-SILICON COMPOUND FORMING METHOD, SEMICONDUCTOR DEVICE MANUFACTURING METHOD, AND SEMICONDUCTOR DEVICE

(75) Inventors: Mitsumasa Koyanagi, Natori (JP); Jeoung Chill Shim, Sendai (JP); Hiroyuki Kurino, Natori (JP)

(73) Assignee: Semiconductor Technology Academic Research Center, Yokohama-Shi (JP)

( * ) Notice: Subject to any disclaimer, the term of this patent is extended or adjusted under 35 U.S.C. 154(b) by 1 day.

(21) Appl. No.: 11/185,157

(22) Filed: Jul. 20, 2005

(65) Prior Publication Data
US 2006/0003584 A1   Jan. 5, 2006

Related U.S. Application Data

(62) Division of application No. 10/405,999, filed on Mar. 31, 2003, now abandoned.

(30) Foreign Application Priority Data

Sep. 13, 2002   (JP)   ............... 2002-268863

(51) Int. Cl.
*H01L 21/44* (2006.01)
(52) U.S. Cl. ...................... 438/664; 438/651
(58) Field of Classification Search ............... 438/663, 438/664, 581, 583, 651, 655; 257/377, 382, 257/384, 388, 412, 413, 766, E29.156, E29.161, 257/E21.006, E21.13, E21.199
See application file for complete search history.

(56) References Cited

U.S. PATENT DOCUMENTS 6,225,197 B1 *   5/2001   Maekawa ................ 438/487
6,506,637 B2      1/2003   Maa et al.

FOREIGN PATENT DOCUMENTS

| JP | 02-187022 A | 7/1990 |
| JP | 07-058063 A | 3/1995 |
| JP | 07-169711 A | 7/1995 |
| JP | 07-263682 A | 10/1995 |
| JP | 08-097420 A | 4/1996 |
| JP | 2000-101075 A | 4/2000 |

OTHER PUBLICATIONS

Office Action (Notification of Reasons for Rejection) from related Japanese Application No. 2003-323434, May 31, 2007.

* cited by examiner

*Primary Examiner*—David Vu
(74) *Attorney, Agent, or Firm*—Christensen O'Connor Johnson Kindness PLLC

(57) ABSTRACT

A nickel-silicon compound forming method is disclosed which comprises forming nickel on at least one of only silicon and a compound containing silicon, and performing stepwise-heating of the nickel together with the at least one of only silicon and the compound containing silicon.

24 Claims, 4 Drawing Sheets

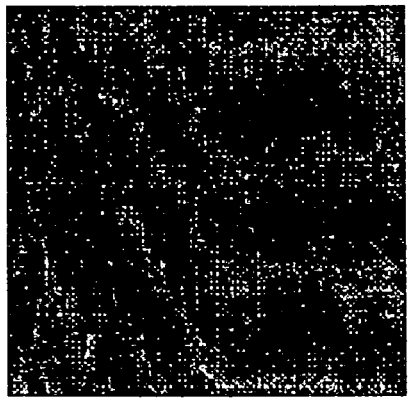
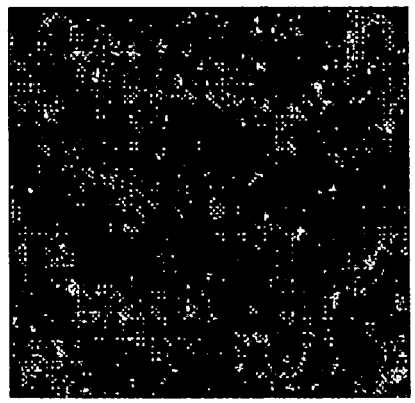
FIG. 4A          FIG. 4B
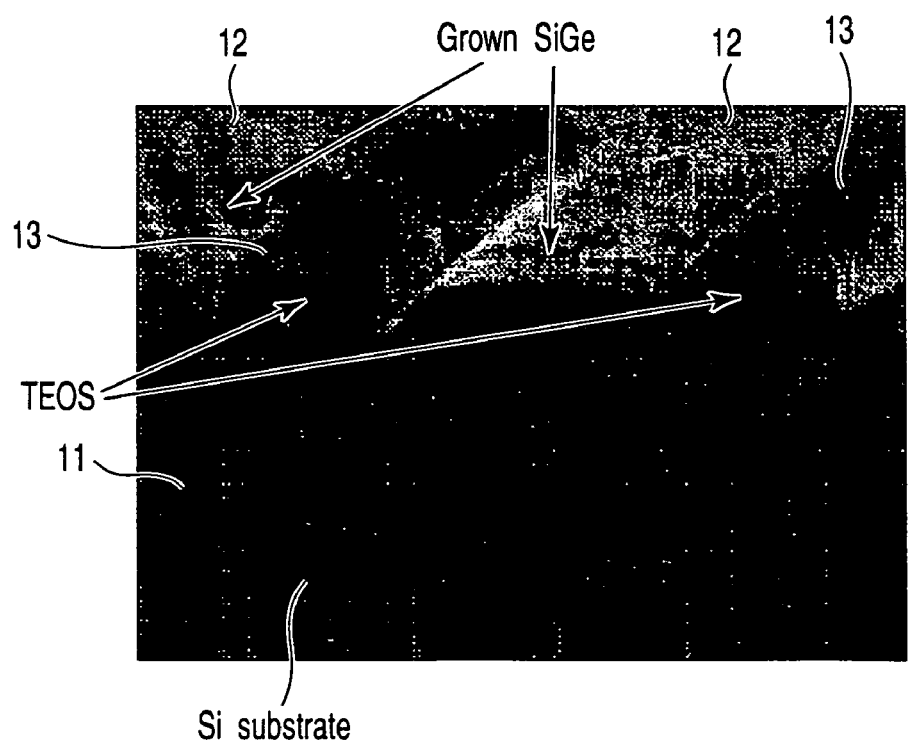
FIG. 5

NICKEL-SILICON COMPOUND FORMING METHOD, SEMICONDUCTOR DEVICE MANUFACTURING METHOD, AND SEMICONDUCTOR DEVICE

CROSS-REFERENCE TO RELATED APPLICATIONS

This application is a divisional of U.S. patent application Ser. No. 10/405,999, filed Mar. 31, 2003, now abandoned which is based upon and claims the benefit of priority from the prior Japanese Patent Application No. 2002-268863, filed Sept. 13, 2002, the entire contents of which are incorporated herein by reference.

BACKGROUND OF THE INVENTION

1. Field of the Invention

The present invention relates to a technique capable of improving the electrical characteristics of a semiconductor device and, in particular, to a nickel-silicon compound forming method, semiconductor device manufacturing method, and semiconductor device which can improve the electrical properties of a transistor.

2. Description of the Related Art

Recently, various types of semiconductor devices represented by an LSI have been greatly developed owing to micronization and high-integration of various types of semiconductor elements represented by a transistor. One factor of this may, for example, be a size reduction in a transistor which leads to a lower resistance and a larger amount of current flow on a small transistor. However, as the on resistance of the transistor decreases, the parasitic resistances in the source, drain, and gate which are the main parts of the transistor become non-negligible. To decrease the parasitic resistances in, e.g., a source, drain, and gate, a compound called a silicide or salicide that is a compound of a metal and silicon has been started in use. For example, titanium (Ti), tungsten (W), or cobalt (Co) is generally used as a material of a silicide.

However, as the gate of a transistor nowadays has a size of 50 nm or less, nickel (Ni) has received attention as a silicide material with lower resistance. For example, nickel mono silicide (NiSi) has a lower contact resistance and resistivity than that of a silicide containing Ti, W, or Co. Thus, NiSi has been expected as a feature silicide or salicide material that is to form the main part of a transistor.

In a general semiconductor device manufacturing process, it is ideal to form an NiSi film capable of withstanding high temperatures of 500° C. or more. However, after an Ni film is formed on an Si film, an NiSi film is typically formed by increasing the temperature to near 350° C. at once. This is because when the NiSi film is to be formed by increasing the temperature to near 500° C. at once, cohesion occurs in the NiSi film, and its composition changes into $NiSi_2$ to increase the resistivity. To avoid this problem, it has been a common practice to form an NiSi film at a low temperature near 350° C. Consequently, annealing at a high temperature cannot be performed after NiSi film formation, and this prevents practical use of the film in the various types of semiconductor devices represented by LSIs.

BRIEF SUMMARY OF THE INVENTION

According to an aspect of the invention, there is provided a nickel-silicon compound forming method comprising forming nickel on at least one of only silicon and a compound containing silicon, and performing stepwise-heating of the nickel together with the at least one of only silicon and the compound containing silicon, wherein a temperature is raised and maintained alternately.

According to another aspect of the invention, there is provided a semiconductor device manufacturing method comprising forming a nickel-silicon compound on a semiconductor element comprising at least one of only silicon and a compound containing silicon, wherein the nickel-silicon compound is formed on the semiconductor element by forming nickel on the at least one of only silicon and the compound containing silicon, and performing stepwise-heating of the nickel together with the at least one of only silicon and the compound containing silicon, wherein a temperature is raised and maintained alternately.

According to a further aspect of the invention, there is provided a semiconductor device comprising a semiconductor element, wherein the semiconductor element has a portion formed by at least one of only silicon and a compound containing silicon, a nickel-silicon compound is formed on the portion, and the nickel-silicon compound is formed on the portion by forming nickel on the at least one of only silicon and the compound containing silicon, and performing stepwise-heating of the nickel together with the at least one of only silicon and the compound containing silicon.

BRIEF DESCRIPTION OF THE SEVERAL VIEWS OF THE DRAWING

FIG. 4A is an electron microscope photograph which shows the surface state of an NiSi film formed at 800° C. on an Si substrate by the nickel-silicon compound forming method according to the first embodiment;

FIG. 4B is an electron microscope photograph which shows the surface state of an NiSi film formed at 900° C. on an Si substrate by the nickel-silicon compound forming method according to the first embodiment;

FIG. 5 is an electron microscope photograph which shows SiGe underlying an NiSi film on an Si substrate according to the second embodiment;

DETAILED DESCRIPTION OF THE INVENTION

The present invention will be described below in detail with reference to the accompanying drawings.

First Embodiment

Figure 1:
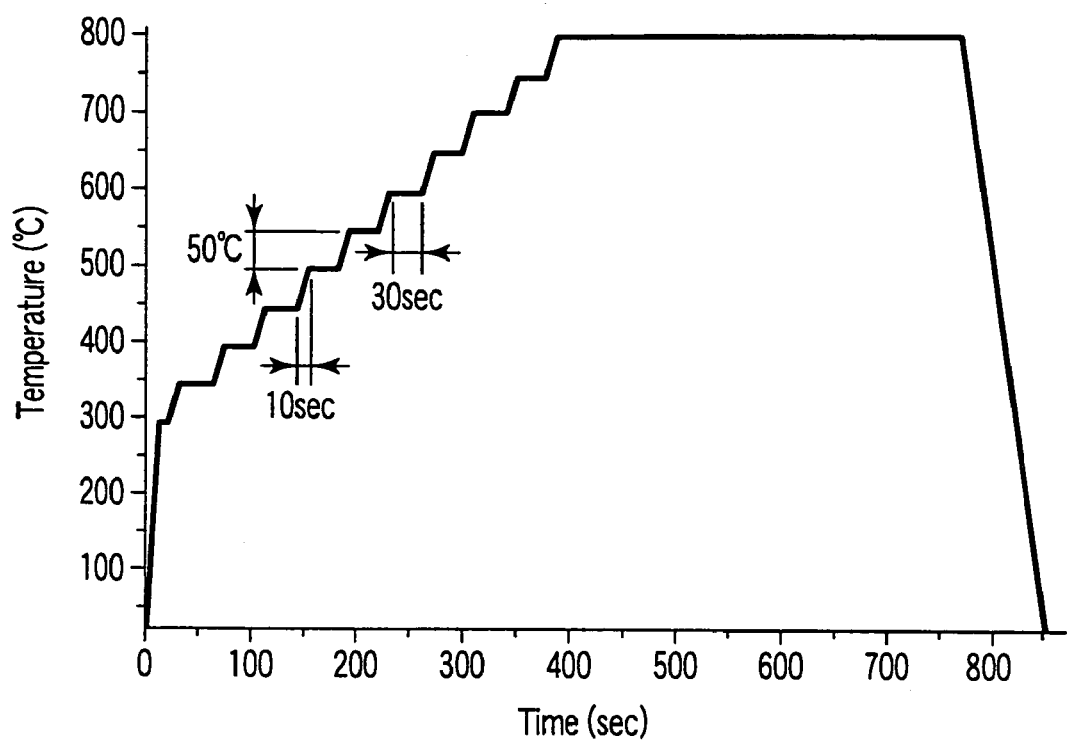
FIG. 1 is a graph showing a change in temperature in a nickel-silicon compound forming method according to the first embodiment.
Figure 2:
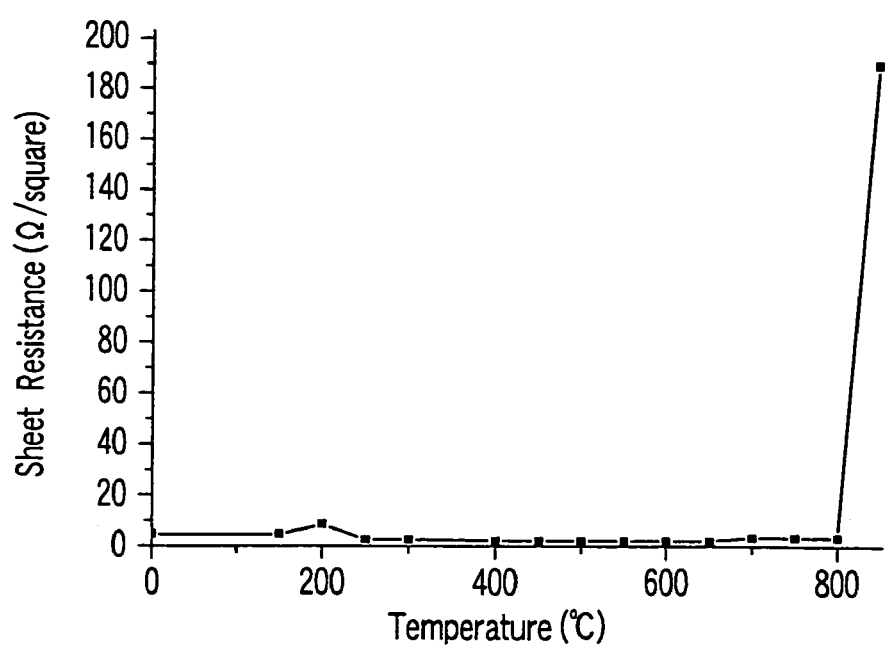
FIG. 2 is a graph showing the temperature dependence of the sheet resistance of an NiSi film formed on an Si substrate by the nickel-silicon compound forming method according to the first embodiment.
Figure 3:
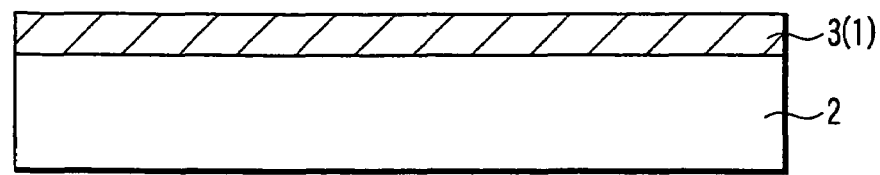
FIG. 3 is a sectional view showing the NiSi film formed on the Si substrate by the nickel-silicon compound forming method according to the first embodiment.

The first embodiment will be described first with reference to FIGS. 1 to 4A and 4B. FIG. 1 is a graph showing a change in temperature in a nickel-silicon compound forming method according to this embodiment. FIG. 2 is a graph showing the temperature dependence of the sheet resistance of an NiSi film formed on an Si substrate by the nickel-silicon compound forming method according to this embodiment. FIG. 3 is a sectional view showing the NiSi film formed on the Si substrate by the nickel-silicon compound forming method according to this embodiment. FIGS. 4A and 4B are electron microscope photographs which show the surface states of NiSi films formed at 800° C. and 900° C., respectively, on Si substrates by the nickel-silicon compound forming method according to this embodiment.

In this embodiment, a case wherein a nickel mono silicide (NiSi) film serving as a nickel-silicon compound is formed on a silicon (Si) substrate will be described.

As shown in FIG. 3, first, a nickel (Ni) film 1 is deposited on a p-type silicon substrate 2. This embodiment uses the Si substrate (silicon wafer) 2 with plane indices (1 0 0). The Si (1 0 0) substrate 2 is simply referred to as the Si substrate 2, hereinafter. The Si substrate 2 is cleaned by a hydrofluoric acid (HF) which is diluted in advance before deposition of the Ni film 1. The Ni film 1 is deposited on the Si substrate 2 by sputtering until the Ni film 1 has a thickness of about 30 nm.

The Si substrate 2 with the Ni film 1 is then silicided. More specifically, this process has a characteristic feature that the Ni film 1 is heated stepwise together with only Si or an Si compound. Such stepwise heating is particularly referred to as a multi-step annealing.

The Si substrate 2 with the Ni film 1 undergoes the multi-step annealing. This multi-step annealing is performed by using a rapid thermal anneal system (RTA system: not shown). More specifically, the multi-step annealing of this embodiment is so performed as to make a change in temperature therein along with the graph shown in FIG. 1.

First, the Si substrate 2 with the Ni film 1 is heated to increase their temperature from a temperature $T_0$ to a temperature $T_1$. Thereafter, the Ni film 1 and Si substrate 2 are heated stepwise. That is, a step of increasing, by a temperature $\Delta T$ over a period of time $S_1$, the temperature of the Ni film 1 and Si substrate 2 that has been increased from the temperature $T_0$ to the temperature $T_1$ and keeping the resultant temperature for a period of time $S_2$ is repeated a plurality of times. These steps heat the Ni film 1 and Si substrate 2 from the temperature $T_0$ to the temperature $T_2$ stepwise.

More specifically, first, the temperature of the Ni film 1 and Si substrate 2 is rapidly increased from about 0° C. to about 300° C. at once. Subsequently, the temperature of the Ni film 1 and Si substrate 2 that has been increased at about 300° C. is further increased by about 50° C. over 10 sec. That is, the Ni film 1 and Si substrate 2 are heated from the temperature of about 300° C. to about 350° C. in 10 sec. Thereafter, the temperature of the Ni film 1 and Si substrate 2 is kept at about 350° C. for 30 sec. The step of increasing the temperature of the Ni film 1 and Si substrate 2 by about 50° C. over 10 sec and keeping the resultant temperature for 30 sec is then repeated nine times. With this processing, the temperature of the Ni film 1 and Si substrate 2 is increased from about 300° C. to about 800° C. stepwise. That is, the Ni film 1 and Si substrate 2 are heated and heat-insulated 10 times each having a period of almost 40 sec/step, so that their temperature is increased from about 300° C. to about 800° C. stepwise. This period is referred to as a ramp-up period. In this embodiment, the temperature of the Ni film 1 and Si substrate 2 is increased from about 300° C. to about 800° C. over a total of about 400 sec stepwise.

After the Ni film 1 and Si substrate 2 are heated to have the temperature of about 800° C., their temperature is kept at about 800° C. for a period of time almost equal to that required for the heating steps. The Ni film and Si substrate are then cooled and rapidly decreased in temperature from about 800° C. to about 0° C. at once. As shown in FIG. 1, the multi-step annealing of this embodiment requires about 800 sec per process. A nickel mono silicide film (NiSi film) 3 is formed on the Si (1 0 0) substrate 2 by the above-described steps.

According to experiments that have been conducted by the present inventors, in the NiSi film 3 formed by the multi-step annealing of this embodiment, cohesion and a change in its composition into $NiSi_2$ hardly occurred. In addition, as shown in FIG. 2, the sheet resistance of the NiSi film 3 in this embodiment can be kept as low as a maximum of about 10 Ω/□ up to about 800° C. This is a good value that can be sufficiently applied even to a fine transistor having a gate with a size of about 50 nm or less. Further, as shown in FIG. 4A, the surface of the NiSi film 3 in this embodiment can be kept in a smooth, good, and almost uniform state without roughness up to 800° C. That is, the surface of the NiSi film 3 can be kept in a so-called mirror-surface state or a cleaned good state up to 800° C. This is a good state that can be sufficiently applied even to a fine transistor having a gate with a size of about 50 nm or less. The temperature of about 800° C. is sufficiently higher than that for a process such as a general LSI wiring step.

Therefore, the NiSi film 3 in this embodiment has a very high applicability to various types of semiconductor elements, e.g., a MOS transistor and the like, and to various types of semiconductor devices including various types of semiconductor elements, e.g., an LSI and the like. That is, the NiSi film 3 in this embodiment has a very high practicability. However, as shown in FIG. 4B, cohesion and the like occur on the surface of the NiSi film 3 at the temperature of about 900° C., so a smooth and almost uniform mirror-surface state cannot be obtained at this temperature. Experiments that have been conducted by the present inventors reveal that the NiSi film 3 formed by heating it to about 800° C. by the multi-step annealing of this embodiment can maintain good quality up to 800° C. even in annealing that is performed thereafter. That is, the NiSi film 3 formed by the multi-step annealing of this embodiment can maintain good quality in subsequent annealing up to a maximum temperature to which the film has been exposed in film formation.

Inspections that have been conducted by the present inventors by using an X-ray diffraction (XRD) method reveal that almost all nickel silicide ($NiSi_x$) films 3 can be formed as the nickel mono-silicide (NiSi) films 3 by setting a proper film formation environment. In addition, the stoichiometric ratio of the NiSi film 3 formed by the multi-step annealing of this embodiment greatly depends on the temperature increase rate and temperature keeping time in the stepwise heating step. That is, according to the multi-step annealing of this embodiment, when a temperature increase rate and temperature keeping time are appropriately regulated to proper values, $NiSi_x$ films 3 of desired quality including an NiSi film 3 can be formed.

As described above, according to the first embodiment, an NiSi film 3 of good quality which can be improved in electrical characteristics and has a stable composition even at high temperatures of about 500° C. or more in a general semiconductor device manufacturing process can be formed on the Si substrate 2. Accordingly, NiSi films 3 with very high practicability can be formed as materials of forming various types of next-generation semiconductor elements represented by, e.g., a fine transistor having a gate with a size of about 50 nm or less. An NiSi film 3 with very high practicability that is well suited to next-generation semiconductor devices represented by a very fine higher-integrated LSI with higher-performance which includes fine semiconductor elements can be formed.

Second Embodiment

Figure 6:
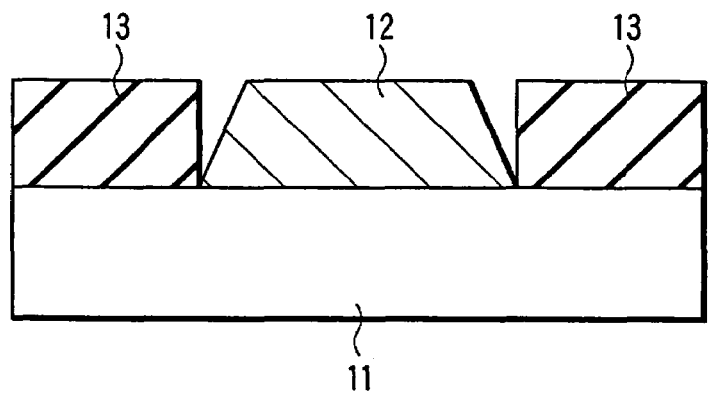
FIG. 6 is a sectional view showing SiGe underlying the NiSi film on the Si substrate according to the second embodiment.
Figure 7:
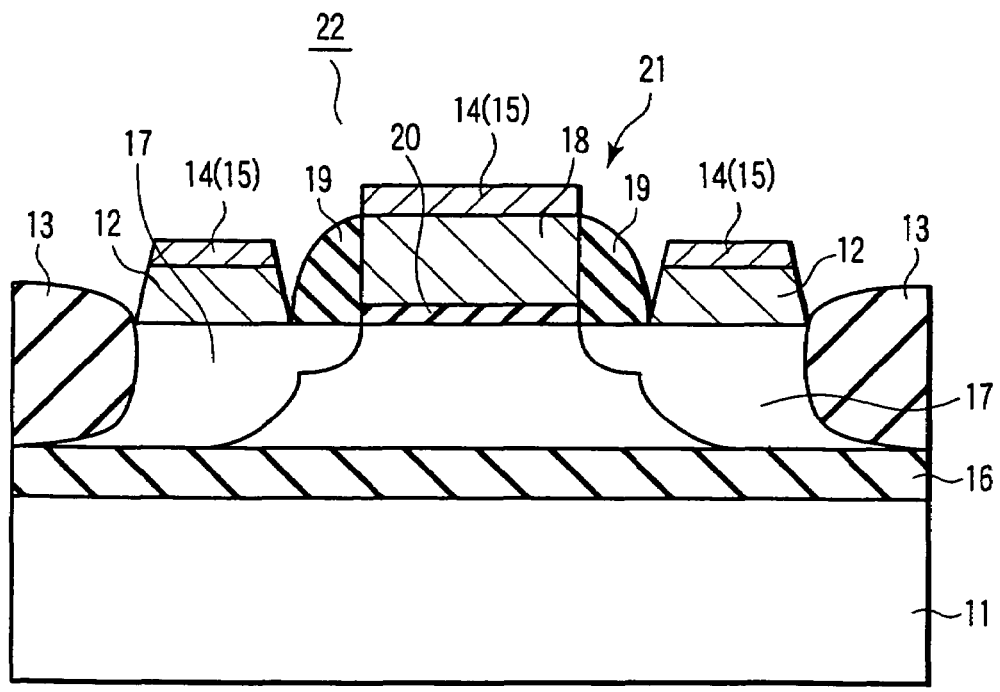
FIG. 7 is a sectional view showing the NiSi film and the structure near a transistor of a semiconductor device according to the second embodiment.
Figure 8:
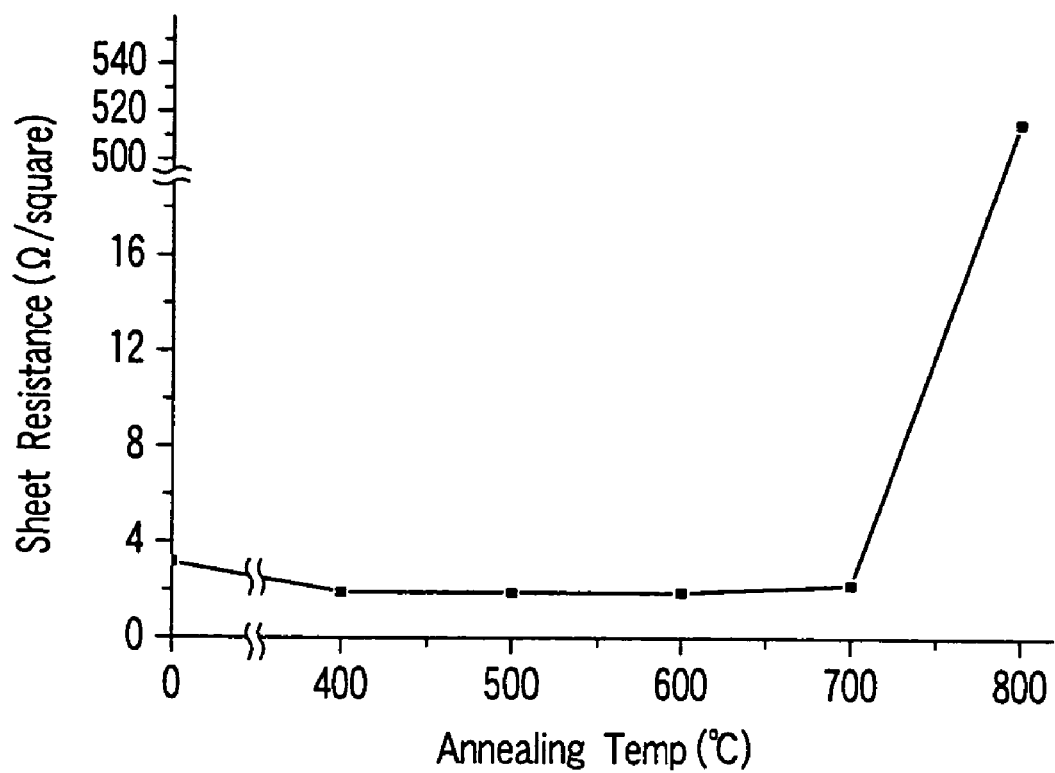
FIG. 8 is a graph showing the temperature dependence of the sheet resistance of the NiSi film formed on SiGe according to the second embodiment.

The second embodiment will be described next with reference to FIGS. 5 to 8. FIG. 5 is an electron microscope photograph which shows SiGe underlying an NiSi film on an Si substrate according to this embodiment. FIG. 6 is a sectional view showing SiGe underlying the NiSi film on the Si substrate according to this embodiment. FIG. 7 is a sectional view showing the NiSi film and the structure near a transistor of a semiconductor device according to this embodiment. FIG. 8 is a graph showing the temperature dependence of the sheet resistance of the NiSi film formed on SiGe according to this embodiment. A detailed description of the same parts as in the first embodiment is omitted.

In this embodiment, a case wherein an NiSi film is formed on the silicon germanium (SiGe) film which, in turn, is formed on an Si substrate will be described. More specifically, NiSi films are formed on the source and drain of a transistor that are elevated on the surface of the Si substrate by using a compound containing Si (SiGe). A nickel-silicon compound forming method, semiconductor device manufacturing method, and semiconductor device according to this embodiment will be described together along the order of steps in the semiconductor device manufacturing method.

As shown in FIGS. 5 and 6, first, a silicon germanium (SiGe) film 12 is formed on an Si substrate 11. As the Si substrate 11, the same Si (1 0 0) substrate 11 as in the first embodiment is used. On the surface of the Si substrate 11, an insulating film layer (insulating isolation region pattern) 13 made of a predetermined pattern is oxidized and formed in advance. The SiGe film 12 is selectively formed on the Si substrate 11 by epitaxial growth. This will be described in detail below.

More specifically, the SiGe film 12 is deposited on the Si substrate 11 by UHV-CVD which uses $Si_2H_6$ and $GeH_4$ as gas sources. This UHV-CVD is performed by using an UHV-CVD system (not shown). The ultimate pressure of the UHV-CVD system is $10^{-10}$ Torr. The pressure during epitaxial growth is $10^{-5}$ Torr or less. The growth chamber of the UHV-CVD system is cooled by liquid nitrogen during epitaxial growth. The SiGe film 12 is thermally cleaned at about 800° C. and then epitaxially grown at about 630° C. The composition of germanium (Ge) on the SiGe film 12 is controlled by changing the flow rate of the gas sources $Si_2H_6$ and $GeH_4$.

FIG. 5 shows an electron microscope image of the section of the SiGe film (SiGe layer) 12 which has been selectively formed on the Si substrate 11 by epitaxial growth. The epitaxially-grown SiGe film 12 had a thickness of about 60 nm. In addition, no SiGe film 12 was formed on the uppermost portion of the TEOS film 13 serving as the insulating film layer (insulating isolation region pattern). That is, no SiGe film 12 was epitaxially grown on the TEOS film 13.

As shown in FIG. 7, an NiSi film 14 is formed on the SiGe film 12. The NiSi film 14 is formed by forming an Ni film 15 on the SiGe film 12 which has been selectively formed on the Si substrate 11 by epitaxial growth on the Si substrate 11, and then siliciding the Ni film 15. FIG. 7 is a detailed view showing the vicinity of the Si substrate 11 in FIG. 6. This will be described in detail below.

The SiGe film 12 with a thickness of about 60 nm is formed by the above-described step on the p-type Si (1 0 0) substrate 11 having the insulating isolation region pattern 13, i.e., the p-type SOI wafer 11. An oxide film 16 and source/drain region ($N^+$ region) 17 containing silicon are formed on the p-type SOI substrate 11. In addition, a gate 18 containing Si and gate sidewalls 19 and 20 made of an insulating material are formed on the p-type SOI substrate 11.

As described above, the SiGe film 12 is formed on the region of the p-type SOI substrates 11 where no insulators represented by a TEOS film (insulating isolation region pattern) 13 are formed. More specifically, the SiGe film 12 is contiguous to the source/drain region ($N^+$ region) 17 formed on the uppermost portion of the Si substrate 11, and is elevated on the surface of the source/drain region ($N^+$ region) 17. That is, the SiGe film 12 forms a so-called elevated source/drain region structure together with the source/drain region 17.

The p-type SOI substrate 11 is cleaned by a diluted hydrofluoric acid (HF) immediately after the SiGe film 12 is epitaxially grown on the source/drain region 17. Subsequently, the p-type SOI substrate 11 is introduced into the chamber of the sputtering apparatus. In this chamber, an Ni film 15 is deposited to a thickness of about 30 nm by sputtering on the surface of the SiGe film 12 which has been formed by being elevated on the surface of the p-type SOI substrate 11.

Then, the p-type SOI substrate 11 with the Ni film 15 is introduced into the chamber of a rapid thermal anneal system (RTA system). The p-type SOI substrate 11 undergoes annealing. More specifically, the p-type SOI substrate 11 undergoes annealing by the same multi-step annealing as in the first embodiment. In this embodiment, however, the p-type SOI substrate 11 is heated stepwise in the range of about 400° C. to about 700° C. The Ni film 15 on the SiGe film 12 is silicided by the above-described steps. NiSi films 14 are thus formed on the p-type SOI substrate 11. More specifically, above the p-type SOI substrate 11, the NiSi films 14 are selectively formed on the respective surfaces (upper surfaces) of the gate 18 and the SiGe film 12 formed by being elevated on the p-type SOI substrate 11. Consequently, a MOS transistor 21 serving as a semiconductor element is formed.

Thereafter, a desired semiconductor device 22 shown in FIG. 7 is obtained through the predetermined steps. That is, the semiconductor device 22 is obtained which includes the MOS transistor 21 in which the NiSi films 14 are formed on only the respective surfaces (upper surfaces) of the gate 18 and the SiGe film 12 with the so-called elevated source/drain structure.

According to experiments that have been conducted by the present inventors, in the NiSi film 14 formed on the SiGe film 12 by the multi-step annealing of this embodiment, the annealing temperature dependence on the sheet resistance of the NiSi film 14 represents a tendency shown in a graph in FIG. 8. In particular, when the annealing temperature is set at less than 700° C., the sheet resistance of the NiSi film 14 in this embodiment can be kept as very low as a maximum of about 2 Ω/□.

As described above, according to the second embodiment, the same effects as in the first embodiment can be obtained.

In addition, a film including a composite structure of an NiSi film 14 and SiGe film 12, which has greatly improved electrical characteristics and a stable composition even at high temperatures in a semiconductor device manufacturing process, can be formed on the Si substrate 11. More specifically, a source/drain structure in the SOI-MOSFET transistor 21 serving as a MOS transistor is formed by, e.g., adding an NiSi film 14 with good electrical characteristics to the elevated source/drain structure formed by forming the SiGe film 12 on the surface of the source/drain region 17. As a result, the electrical characteristics of the SOI-MOSFET 21, and the semiconductor device 22 including the SOI-MOSFET 21 can be improved.

As described above, according to the nickel-silicon compound forming method in this embodiment, a nickel silicide 14 of good quality with a low resistance can be formed on not only Si 11 but also the compound 12 containing silicon represented by SiGe. In addition, according to the semiconductor device manufacturing method in this embodiment to which the nickel-silicon compound forming method in this embodiment is applied, the semiconductor element 21 is formed by using a nickel silicide 14 of good quality with a low resistance, so that the electrical characteristics of the semiconductor element 21 can be improved. The electrical characteristics of the semiconductor device 22 including the semiconductor element 21 described above can be improved. The semiconductor device 22 in this embodiment manufactured by applying the nickel-silicon compound forming method in this embodiment therefore has improved electrical characteristics.

Note that the nickel-silicon compound forming method, semiconductor device manufacturing method, an d semiconductor device according to the present invention are not limited to the first and second embodiments described above. The present invention can be practiced by modifying some steps in the first and second embodiments into various settings or appropriately using a proper combination of various types of settings without departing from the spirit and scope of the present invention.

For example, the starting temperature of the multi-step annealing, and the period of time, the period, and the number of steps which are required for the heat increasing step and temperature keeping step in the multi-step annealing, or the period of time required for the heat-insulating step and cooling step thereafter are appropriately set in proper values, so that an NiSi film of desired quality can be formed. In addition, the substance underlying the NiSi film is not limited to the Si substrate or SiGe film, and any substance containing Si may be used.

Also, the thickness of the formed NiSi film or the thickness of an underlying film formed from only silicon or a compound containing silicon can be appropriately set in a proper value in accordance with the film formation condition or desired electrical characteristics of the semiconductor element or semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A nickel-silicon compound forming method comprising:
    forming nickel on at least one of only silicon and a compound containing silicon; and
    performing stepwise-heating of the nickel together with said at least one of only silicon and the compound containing silicon, wherein a temperature is raised and maintained alternately.

2. A method according to claim 1, wherein
the stepwise heating includes:
    after the nickel is heated from a temperature $T_0$ to a temperature of $T_1$ together with said at least one of only silicon and the compound containing silicon;
    repeating a plurality of times a step of increasing, by a temperature $\Delta T$ over a period of time $S_1$, the temperature $T_1$ of the nickel and said at least one of only silicon and the compound containing silicon, and keeping a resultant temperature for a period of time $S_2$; and
    thereby heating the nickel from the temperature $T_0$ to a temperature $T_2$ by the temperature $\Delta T$ stepwise together with said at least one of only silicon and the compound containing silicon.

3. A method according to claim 2, wherein
in the stepwise heating, the period of time $S_1$ is shorter than the period of time $S_2$.

4. A method according to claim 2, wherein
in the stepwise heating, the temperature $\Delta T$ is lower than a difference between the temperature $T_1$ and temperature $T_0$.

5. The method according to claim 2, wherein
the nickel is heated to the temperature $T_2$ stepwise together with said at least one of only silicon and the compound containing silicon, and the temperature $T_2$ is then kept for a period of time substantially equal to that required for the stepwise heating.

6. The method according to claim 2, wherein
the nickel is heated to the temperature $T_2$ stepwise together with said at least one of only silicon and the compound containing silicon, the temperature $T_2$ is kept for a period of time substantially equal to that required for the stepwise heating, and the nickel is then cooled to the temperature $T_0$.

7. The method according to claim 2, wherein
in the stepwise heating, the temperature $T_1$ is not more than 350° C., and the temperature $T_2$ falls within a range between 450° C. (inclusive) and 900° C. (exclusive).

8. The method according to claim 2, wherein
the compound containing silicon includes silicon germanium.

9. A method according to claim 1, wherein
the compound containing silicon includes silicon germanium.

10. The method according to claim 1, wherein
nickel mono silicide is formed on said at least one of only silicon and the compound containing silicon.

11. The method according to claim 1, comprising more than one time period of maintaining the temperature following a time period of raising the temperature, and each time period of maintaining the temperature is the same.

12. The method according to claim 1, comprising a time period of maintaining the temperature following time periods of raising the temperature, and each time period of raising the temperature is the same.

13. The method according to claim 1, comprising a time period of maintaining the temperature following two or more time periods of raising the temperature, and each rise in temperature is the same.

14. A semiconductor device manufacturing method comprising:
forming a nickel-silicon compound on a semiconductor element comprising at least one of only silicon and a compound containing silicon;
wherein the nickel-silicon compound is formed on the semiconductor element by;
forming nickel on said at least one of only silicon and the compound containing silicon; and
performing stepwise-heating of the nickel together with said at least one of only silicon and the compound containing silicon, wherein a temperature is raised and maintained alternately.

15. The method according to claim 14, wherein
the stepwise heating includes:
after the nickel is heated from a temperature $T_0$ to a temperature $T_1$ together with said at least one of only silicon and the compound containing silicon;
repeating a plurality of times a step of increasing, by a temperature $\Delta T$ over a period of time $S_1$, the temperature $T_1$ of the nickel and said at least one of only silicon and the compound containing silicon, and keeping a resultant temperature for a period of time $S_2$; and
thereby heating the nickel from the temperature $T_0$ to a temperature $T_2$ by the temperature $\Delta T$ stepwise together with said at least one of only silicon and the compound containing silicon.

16. The method according to claim 15, wherein
in the stepwise heating, the period of time $S_1$ is shorter than the period of time $S_2$.

17. The method according to claim 15, wherein
in the stepwise heating, the temperature $\Delta T$ is lower than a difference between the temperature $T_1$ and temperature $T_0$.

18. The method according to claim 15, wherein
the nickel is heated to the temperature $T_2$ stepwise together with said at least one of only silicon and the compound containing silicon, and the temperature $T_2$ is then kept for a period of time substantially equal to that required for the stepwise heating.

19. The method according to claim 15, wherein
the nickel is heated to the temperature $T_2$ stepwise together with said at least one of only silicon and the compound containing silicon, the temperature $T_2$ is kept for a period of time substantially equal to that required for the stepwise heating, and the nickel is then cooled to the temperature $T_0$.

20. The method according to claim 15, wherein
in the stepwise heating, the temperature $T_1$ is not more than 350° C., and the temperature $T_2$ falls within a range between 450° C. (inclusive) and 900° C. (exclusive).

21. The method according to claim 15, wherein
the compound containing silicon includes silicon germanium.

22. The method according to claim 14, wherein
the compound containing silicon includes silicon germanium.

23. The method according to claim 14, wherein
the semiconductor clement includes a transistor, and the nickel-silicon compound is formed at least one of a source, drain, and gate of the transistor.

24. The method according to claim 23, wherein
nickel mono silicide is formed as the nickel-silicon compound.

* * * * *

UNITED STATES PATENT AND TRADEMARK OFFICE
CERTIFICATE OF CORRECTION

PATENT NO. : 7,303,990 B2 Page 1 of 1
APPLICATION NO. : 11/185157
DATED : December 4, 2007
INVENTOR(S) : M. Koyanagi et al.

It is certified that error appears in the above-identified patent and that said Letters Patent is hereby corrected as shown below:

COLUMN     LINE

10     31     "is formed at least" should read --forms at least--
(Claim 23,   line 3)

Signed and Sealed this

Twenty-ninth Day of April, 2008

JON W. DUDAS
*Director of the United States Patent and Trademark Office*